(12) United States Patent
Lofaro et al.

(10) Patent No.: US 10,644,233 B2
(45) Date of Patent: May 5, 2020

(54) COMBINED CMP AND RIE CONTACT SCHEME FOR MRAM APPLICATIONS

(71) Applicant: INTERNATIONAL BUSINESS MACHINES CORPORATION, Armonk, NY (US)

(72) Inventors: Michael F. Lofaro, Brookfield, CT (US); Nathan P. Marchack, White Plains, NY (US); Janusz J. Nowak, Highland Mills, NY (US); Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 15/961,221

(22) Filed: Apr. 24, 2018

(65) Prior Publication Data

US 2018/0254411 A1 Sep. 6, 2018

Related U.S. Application Data

(63) Continuation of application No. 15/800,917, filed on Nov. 1, 2017, now Pat. No. 10,236,443, which is a (Continued)

(51) Int. Cl.
*H01L 43/12* (2006.01)
*H01L 27/22* (2006.01)
(Continued)

(52) U.S. Cl.
CPC ............ *H01L 43/12* (2013.01); *H01L 27/222* (2013.01); *H01L 43/02* (2013.01); *H01L 43/08* (2013.01)

(58) Field of Classification Search
CPC ..... H01L 27/222–228; H01L 43/02–10; H01L 43/12–14
See application file for complete search history.

(56) References Cited

U.S. PATENT DOCUMENTS 6,673,675 B2 1/2004 Yates et al.
6,969,895 B2 11/2005 Han et al.
(Continued)

OTHER PUBLICATIONS

List of IBM Patents or Patent Applications Treated as Related dated Apr. 24, 2018, 2 pages.
(Continued)

*Primary Examiner* — Amar Movva
(74) *Attorney, Agent, or Firm* — Tutunjian & Bitetto, P.C.; Kevin Michael Jordan

(57) ABSTRACT

A method is presented for establishing a top contact to a magnetic tunnel junction (MTJ) device, the method including selectively etching, via a first etching process, an oxide layer to expose a top surface of a nitride layer of a dummy fill shape and selectively etching, via a second etching process, a top portion of the nitride layer of the dummy fill shape to expose a top surface thereof. The method further includes selectively etching, via the second etching process, the oxide layer to expose a top surface of a nitride layer of the MTJ device, and selectively etching, via the first etching process, a top portion of the nitride layer of the MTJ device to expose a top surface thereof such that a height of the MTJ device is approximately equal to a height of the dummy fill shape.

18 Claims, 7 Drawing Sheets

Related U.S. Application Data continuation of application No. 15/446,592, filed on Mar. 1, 2017, now Pat. No. 10,014,464.

(51) Int. Cl.
*H01L 43/02* (2006.01)
*H01L 43/08* (2006.01)

(56) References Cited

U.S. PATENT DOCUMENTS

| | | |
|---|---|---|
| 7,112,861 B2 | 9/2006 | Kanakasabapathy et al. |
| 7,241,632 B2 | 7/2007 | Yang |
| 7,596,015 B2 | 9/2009 | Kitagawa et al. |
| 7,880,249 B2 | 2/2011 | Yuan et al. |
| 8,039,372 B2 | 10/2011 | Min et al. |
| 8,772,051 B1* | 7/2014 | Zhong .................. H01L 27/222 438/3 |
| 2005/0127416 A1* | 6/2005 | Han ..................... H01L 27/222 257/293 |
| 2006/0244021 A1* | 11/2006 | Klostermann ...... H01F 10/3254 257/295 |

OTHER PUBLICATIONS

Annunziata et al., "Structure and Method to Reduce Shorting and Process Degradation in STT-MRAM Devices", U.S. Appl. No. 14/950,830, filed Nov. 24, 2015.

E.J. O'Sullivan, "Magnetic Tunnel Junction-Based MRAM and Related Processing Issues", Materials Science. Feb. 14, 2005. pp. 1-17.

Persson et al., "Etch-stop technique for patterning of tunnel junctions for a magnetic field sensor", Journal of Micromechanics and Microengineering. vol. 21. Mar. 10, 2011. pp. 1-8.

\* cited by examiner

COMBINED CMP AND RIE CONTACT SCHEME FOR MRAM APPLICATIONS

BACKGROUND

Technical Field

The present invention relates generally to semiconductor devices, and more specifically, to using chemical-mechanical planarization (CMP) and reactive ion etching (RIE) to establish a top contact to active magnetic tunnel junction (MTJ) devices.

Description of the Related Art

A spin torque magnetic random access memory (MRAM) device uses a two terminal spin-torque based memory element. The two terminal spin-torque based memory element includes a pinned layer, a tunnel barrier layer, and a free layer in a magnetic tunnel junction (MTJ) stack. The pinned layer is also called the reference layer. The magnetization of the pinned layer is fixed in a direction such that when current passes through the MTJ stack, the free layer becomes either parallel or anti-parallel to the pinned layer. Resistance of the device depends on the relative orientation of the free layer and the pinned layer.

SUMMARY

In accordance with an embodiment, a method is provided for establishing a top contact to a magnetic tunnel junction (MTJ) device. The method includes selectively etching, via a first etching process, an oxide layer to expose a top surface of a nitride layer of a dummy fill shape and selectively etching, via a second etching process, a top portion of the nitride layer of the dummy fill shape to expose a top surface thereof. The method further includes selectively etching, via the second etching process, the oxide layer to expose a top surface of a nitride layer of the MTJ device, and selectively etching, via the first etching process, a top portion of the nitride layer of the MTJ device to expose a top surface thereof such that a height of the MTJ device is approximately equal to a height of the dummy fill shape.

In accordance with an embodiment, a method is provided for establishing a top contact to a plurality of magnetic tunnel junction (MTJ) devices. The method includes planarizing the MTJ devices by alternating selective chemical-mechanical planarization (CMP) and reactive ion etch (RIE) processes, and uniformly contacting the MTJ devices across a wafer without exposure to reactive plasma chemistries.

In accordance with another embodiment, a semiconductor structure for establishing a top contact to a magnetic tunnel junction (MTJ) device is provided. The semiconductor structure includes the MTJ device, and a dummy fill shape, the MTJ device and dummy fill shape planarized by alternating selective chemical-mechanical planarization (CMP) and reactive ion etch (RIE) processes such that: an oxide layer is selectively etched by CMP to expose a top surface of a nitride layer of the dummy fill shape, a top portion of the nitride layer of the dummy fill shape is selectively etched by RIE to expose a top surface thereof, the oxide layer is selectively etched by RIE to expose a top surface of a nitride layer of the MTJ device, and a top portion of the nitride layer of the MTJ device is selectively etched by CMP to expose a top surface thereof such that a height of the MTJ device is approximately equal to a height of the dummy fill shape.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
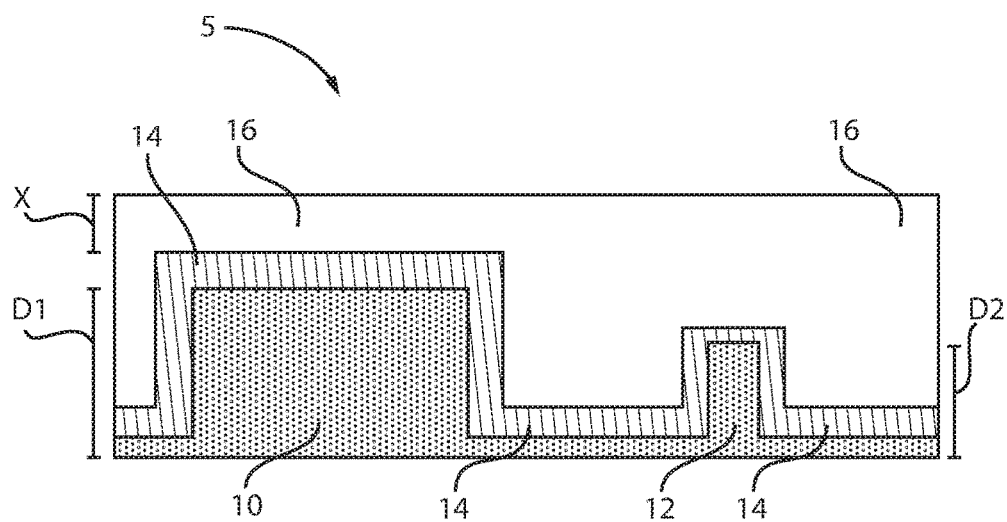
FIG. 1 is a cross-sectional view of a semiconductor structure including a dummy fill shape and a magnetic tunnel junction (MTJ), in accordance with an embodiment of the present invention.

Embodiments in accordance with the present invention provide methods and devices to establish a top contact to a magnetic tunnel junction (MTJ) device. In useful embodiments, selective etching can be employed to etch a first dielectric layer to expose a top surface of a second dielectric layer of a dummy fill shape. A next selective etching process selectively etches a top portion of the second dielectric layer of the dummy fill shape to expose a top surface thereof. It should be understood that the selective etches can include the use of oxide and nitride layers interchangeably for the first and second dielectric layers, although other materials can be employed.

In one or more embodiments, a selective chemical-mechanical planarization (CMP) polish can be used to contact active magnetic tunnel junction (MTJ) devices based on a predetermined height offset between fill shape structures and smaller MTJ devices. A first polish can contact the top of the fill shape structures, followed by a multi-step etching process. The etching process can be, e.g., an RIE process to (1) open a dielectric layer (e.g., silicon nitride (SiN)) encapsulation layer on top of the fill shape structures and (2) pull down a second dielectric layer (e.g., interlayer dielectric (ILD) material (e.g., SiOx)) to the first dielectric layer surrounding the active MTJ devices. A second selective CMP step then pulls the fill shape structure down to the height of the active MTJ devices and opens up the dielectric layer (e.g., nitride layer) to the active MTJ devices. Thus, the MTJs are not exposed to plasma chemistry which can degrade device performance.

In one or more embodiments, a series of alternating selective CMP and RIE steps are used to establish contact to active MTJ devices by using a predetermined height offset between larger fill shape structures and smaller MTJs. Thus, a combined CMP and RIE scheme is used which allows for MTJ devices to be uniformly contacted across a wafer without exposure to reactive plasma chemistries, such as, but not limited to $CF_4/CHF_3$ (tetrafluoromethane/fluoroform) or damaged by ion bombardment.

In one or more embodiments, the specific formation of a metal cap/line layer can be used for intermediate testing of the MTJ devices or arrays and can have a standard metal contact built on top of it. The formation of the metal cap layer is performed by using an inverse of the wiring mask. Thus, a wiring mask (or the inverse thereof) is used to pattern a stop layer, which allows for testing before the MT (metal trench) copper (Cu) line is formed. As a result, the metal cap line extends well over the boundaries defined by the MTJs and thus there is no adverse effects due to chemical interactions.

In one or more embodiments, deposition and patterning of a metal cap layer that utilizes the inverse lithographic pattern of the metal wire contact mask is presented. The metal layer includes, e.g., TaN/Ru/TaN (tantalum nitride/ruthenium/tantalum nitride) and is subtractively etched in a RIE process. Thus, a metal trench layer using a damascene patterning scheme is introduced to create a trench landing on top of the metal line.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Unlike conventional random access memory (RAM) chip technologies, in magnetic RAM (MRAM) data is not stored as electric charge but is instead stored by magnetic polarization of storage elements. The storage elements are formed from two ferromagnetic layers separated by a tunneling barrier layer. One of the two layers, called the fixed layer, has at least one reference magnetic polarization set to a particular polarity. The magnetic polarity of the other magnetic layer, called the free layer, is altered to represent either a "1" (e.g., anti-parallel to the fixed reference layer) or "0" (e.g., parallel to the fixed reference layer). One such device having a fixed layer, a tunneling barrier layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

To write data in a conventional MRAM, a write current is applied through an MTJ. The write current has a magnitude exceeding a level called the critical switching current level which is sufficient to change the orientation of spin or magnetization in the free layer. When the write current flows in a first direction, the MTJ can be placed into or remain in a first state, where its magnetizations are in a parallel orientation. When the write current flows in a second direction, opposite to the first direction, the MTJ can be placed into or remain in a second state, where its magnetizations are in an anti-parallel orientation.

To read data in a conventional MRAM, a read current can flow through the MTJ via the same current path used to write data in the MTJ. If the magnetizations of the MTJ are in a parallel orientation, the MTJ presents a resistance that is different than the resistance the MTJ would present if the magnetizations of the MTJ element were in an anti-parallel orientation. Thus, in a conventional MRAM, there are two distinct states defined by two different resistances, and logic "0" or a logic "1" value can be read based on the state.

Bit cells of a magnetic random access memory can be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

In one category of MRAM memory cells, the direction of polarization of the free layer and the reference layer of a magnetic tunnel junction (MTJ) is parallel to the plane of the respective layer. Such memory cells are referred to as having in-plane magnetic anisotropy or longitudinal magnetic anisotropy (LMA). In another category of MRAM memory cells, the direction of polarization of the free layer and reference layer of an MTJ is perpendicular to the plane of the respective layer. Such memory cells are referred to as having perpendicular magnetic anisotropy (PMA).

FIG. 1 is a cross-sectional view of a semiconductor structure including a dummy fill shape and a magnetic tunnel junction (MTJ), in accordance with an embodiment of the present invention.

A semiconductor structure 5 includes a dummy fill shape 10 and a magnetic tunnel junction (MTJ) 12. A nitride layer 14 can be deposited over the dummy fill shape 10 and the MTJ 12. The nitride layer 14 can be, e.g., a silicon nitride (SiN) layer. An oxide fill takes place. The oxide layer 16 can be an inter-level dielectric (ILD) layer 16. The ILD 16 can extend a distance "X" above the SiN layer 14 formed over the dummy fill shape 10. The dummy fill shape 10 can have a height "D1," whereas the MTJ 12 can have a height "D2." The height "D1" is greater than the height "D2."

In one or more embodiments, the structure 5 can be formed over a substrate (not shown). The substrate can be a semiconductor or an insulator with an active surface semiconductor layer. The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. In one or more embodiments, the substrate can be a silicon wafer. In an embodiment, the substrate is a single crystal silicon wafer.

Regarding the fill shape 10, with the addition of CMP, the mechanical properties of a film and its physical dimensions can influence the planarity of a polished surface. A common issue in semiconductor manufacturing is the "dishing" of the film leading to a non-planar surface. To avoid "dishing," design rules and automated design systems are used to generate "fill shapes." Fill shapes serve as "polishing stops" that avoid the dishing effect. Fill shapes are used in the shallow trench isolation (STI), polysilicon, and metal layers. For metal and polysilicon fill shapes, they are typically "electrically floating." These shapes are placed in open spaces where signal lines or layer shapes are not present. In the instant case, fill shape 10 can be placed in the vicinity of MTJ 12 such that a predetermined height offset between the fill shape 10 and the MTJ 12 aids in the establishment of a top contact for the MTJ 12.

Magnetic Tunneling Junction (MTJ) devices 12 include two ferromagnetic films, or plates, separated by a thin insulating layer to form magnetic storage elements. It will be recognized that the magnetic material can be any suitable material, combination of materials, or alloy that exhibits magnetic properties, such as a ferromagnetic material or a ferromagnetic thin film including CoFe, CoFeB, NiFe, etc. By sharing MRAM manufacturing processes with magnetic film integration techniques, the embodiments described herein are able to more efficiently provide integrated magnetic field enhanced circuit elements.

The magnetic tunnel junction (MTJ) stacks 12 include two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM) array, and as, e.g., a magnetic field sensor, such as a magnetoresistive read head in a magnetic recording disk drive.

MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material, and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ can be used to indicate a logical '1' or '0', thereby storing a bit of information. The TMR of an MTJ determines the difference in resistance between the high and low resistance states. A relatively high difference between the high and low resistance states facilitates read operations in the MRAM.

The ILD oxide 16 is planarized. The ILD oxide 16 can extend over a top surface of the nitride SiN layer 14 formed over both the dummy fill shape 10 and the MTJ 12.

In various embodiments, the height of the ILD oxide fill 16 can be reduced by chemical-mechanical polishing (CMP) and/or etching. Therefore, the planarization process can be provided by CMP. Other planarization process can include grinding and polishing. "Planarization" is a material removal process that employs at least mechanical forces, such as frictional media, to produce a substantially two-dimensional surface. A planarization process can include chemical mechanical polishing (CMP) or grinding. CMP is a material removal process that uses both chemical reactions and mechanical forces to remove material and planarize a surface.

In one or more embodiments, the ILD oxide 16 can have a height in the range of about 20 nm to about 200 nm.

The ILD 16 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 16 include any of the aforementioned materials in porous form, or in a form that changes during processing to or from being porous and/or permeable to being non-porous and/or non-permeable.

In various embodiments, the top sections formed over the structure are removed by, e.g., CMP. Therefore, the planarization process can be provided by CMP. Other planarization process can include grinding and polishing.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 2:
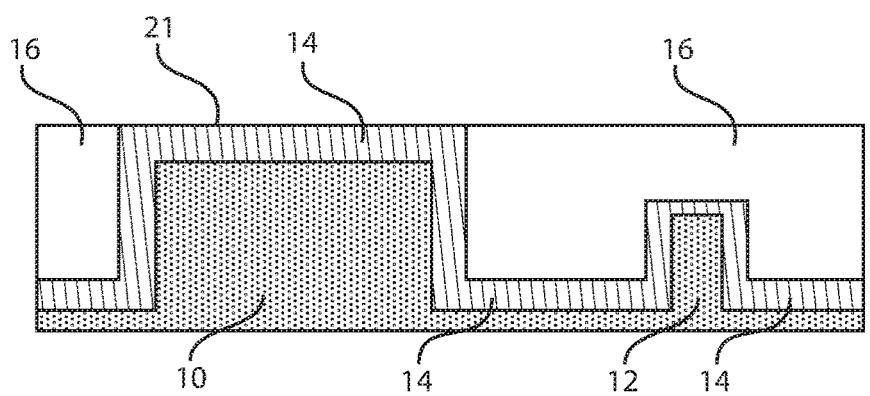
FIG. 2 is a cross-sectional view of the semiconductor structure of FIG. 1 where the oxide layer is selectively etched by chemical-mechanical planarization (CMP) to expose a top surface of a nitride layer formed over the dummy fill shape, in accordance with an embodiment of the present invention.

FIG. 2 is a cross-sectional view of the semiconductor structure of FIG. 1 where the oxide layer is selectively etched by chemical mechanical planarization (CMP) to expose a top surface of a nitride layer formed over the dummy fill shape, in accordance with an embodiment of the present invention.

In various embodiments, the oxide layer 16 is selectively etched by CMP to expose a top surface 21 of the nitride layer 14 formed over the dummy fill shape 10.

In the production of ultra-high density integrated circuits, CMP processes are used to remove material from the surfaces of wafers. In a typical CMP process, a wafer is pressed against a polishing pad in the presence of a slurry under controlled chemical pressure, velocity, and temperature conditions. The slurry solution generally contains small abrasive particles that abrade the surface of the wafer, and chemicals that etch and/or oxidize the surface of the wafer. The polishing pad is generally a planar pad made from a continuous phase matrix material, such as polyurethane. Thus, when the pad and/or the wafer moves with respect to the other, material is removed from the surface of the wafer by the abrasive particles (mechanical removal) and by the chemical (chemical removal) in the slurry.

Figure 3:
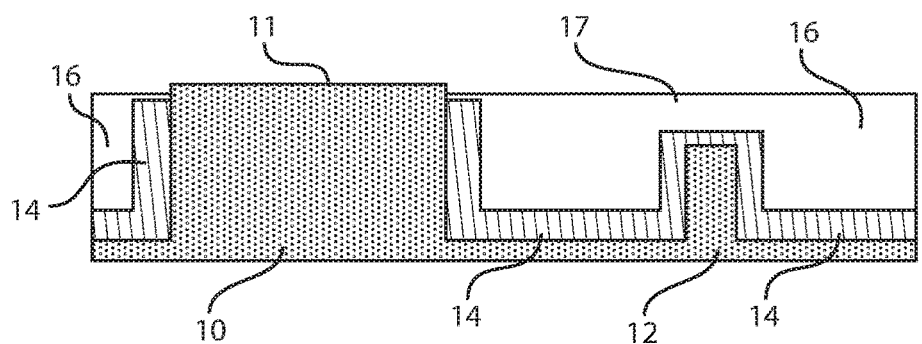
FIG. 3 is a cross-sectional view of the semiconductor structure of FIG. 2 where the nitride layer formed over the dummy fill shape is selectively etched by reactive ion etching (RIE), in accordance with an embodiment of the present invention.

FIG. 3 is a cross-sectional view of the semiconductor structure of FIG. 2 where the nitride layer formed over the dummy fill shape is selectively etched by reactive ion etching (RIE), in accordance with an embodiment of the present invention.

In various embodiments, the nitride layer 14 formed over the dummy fill shape 10 is selectively etched by RIE to expose a top surface 11 of the fill shape 10. Additionally, a portion of the ILD 16 is further etched such that the top surface 17 of the ILD 16 is flush with the top surface 11 of the fill shape 10. The nitride layer 14 formed over the MTJ 12 remains intact during this RIE step.

Figure 4:
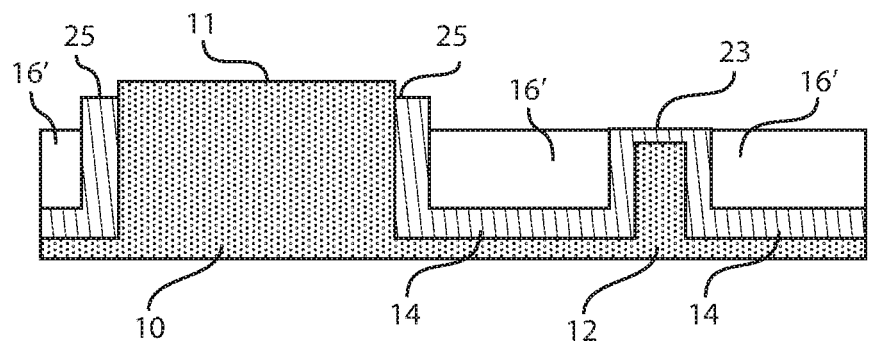
FIG. 4 is a cross-sectional view of the semiconductor structure of FIG. 3 where the oxide layer is further etched by RIE to expose a top surface of the nitride layer formed over the MTJ, in accordance with an embodiment of the present invention.

FIG. 4 is a cross-sectional view of the semiconductor structure of FIG. 3 where the oxide layer is further etched by RIE to expose a top surface of the nitride layer formed over the MTJ, in accordance with an embodiment of the present invention.

In various embodiments, the oxide layer 16 is further etched by RIE to expose a top surface 23 of the nitride layer 14 formed over the MTJ 12. The remaining oxide layer is designated as 16'. Additionally, the RIE etch of this step exposes the top portions or sections 25 of the nitride layer 14 adjacent the top surface 11 of the fill shape 10.

Thus, after the CMP step of FIG. 2, RIE steps are performed in FIGS. 3 and 4. The process then alternates back to a CMP step in FIG. 5.

Figure 5:
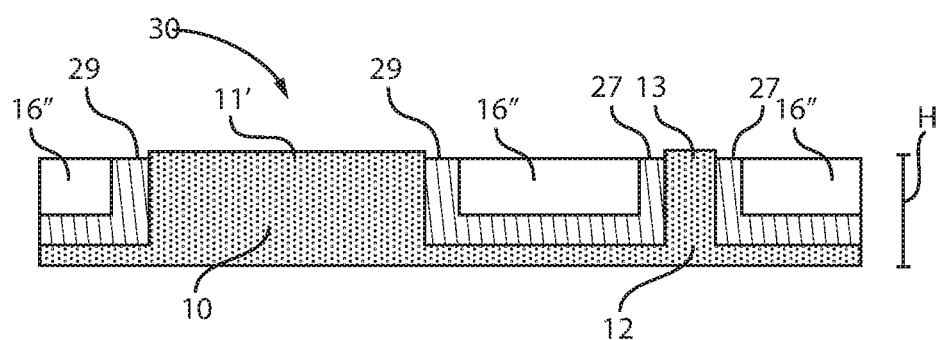
FIG. 5 is a cross-sectional view of the semiconductor structure of FIG. 4 where the nitride layer formed over the MTJ is etched by CMP such that the top surface of the MTJ is flush with the top surface of the dummy fill shape, in accordance with an embodiment of the present invention.

FIG. 5 is a cross-sectional view of the semiconductor device of FIG. 4 where the nitride layer formed over the MTJ is etched by CMP such that the top surface of the MTJ is flush with the top surface of the dummy fill shape, in accordance with an embodiment of the present invention.

In various embodiments, the nitride layer 14 formed over the MTJ 12 is etched by CMP such that the top surface 13 of the MTJ 12 is exposed and is flush with the top surface 11' of the dummy fill shape 10. The nitride layer 14 has a top surface 27 adjacent the top surface 13 of the MTJ 12 and the nitride layer 14 has a top surface 29 adjacent the top surface 11' of the fill shape 10. This CMP step results in the further etching of the oxide layer, thus resulting in remaining oxide layer 16". Moreover, a height "H" of the resulting structure 30 is the same along its entire length. Thus, the fill shape 10 and the MTJ 12 extend up to the same point (top surfaces 11' and 13).

Therefore, active MTJ devices are contacted (e.g., establishing a top contact) via CMP and not exposed to potentially harmful plasma chemistries such as $CF_4/CHF_3$ or damaged by ion bombardment.

Figure 6:
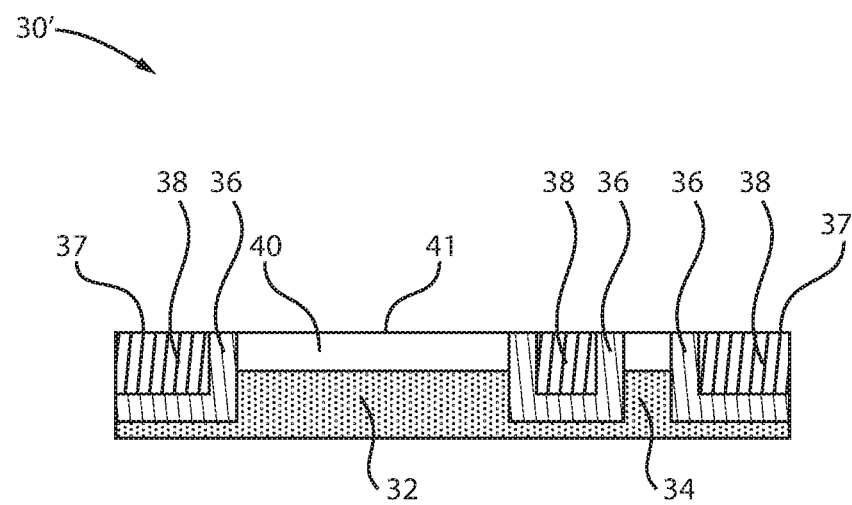
FIG. 6 is a cross-sectional view of a semiconductor structure including a dummy fill shape and a magnetic tunnel junction (MTJ), in accordance with another embodiment of the present invention.

FIG. 6 is a cross-sectional view of a semiconductor structure including a dummy fill shape and a magnetic tunnel junction (MTJ), in accordance with another embodiment of the present invention.

In various embodiments, a semiconductor structure 30' includes a dummy fill shape 34 and a magnetic tunnel junction (MTJ) 32. A nitride layer 36 is deposited over the dummy fill shape 34 and the MTJ 32. The nitride layer 36 can be, e.g., a silicon nitride (SiN) layer. An oxide fill takes place. The oxide layer 38 can be an inter-level dielectric (ILD) layer 38. The oxide layer 28 can be e.g., SiOx. A conducting layer 40 can be formed directly over the dummy fill shape 34 and the MTJ 32. The conducting layer can be a tantalum nitride (TaN) layer 40. The oxide layer 38 can be planarized so that the top surface 37 of the oxide layer 38 is flush with the top surface 41 of the TaN layer 40 formed over the dummy fill shape 34 and the MTJ 32.

Figure 7:
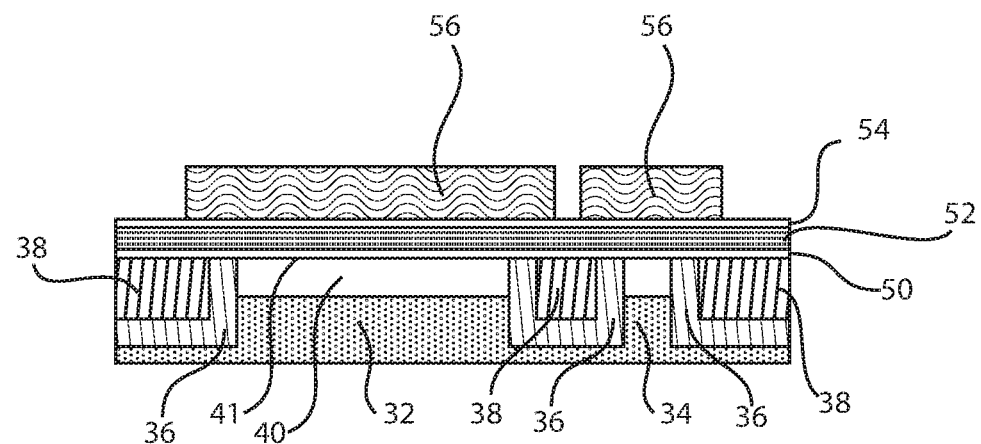
FIG. 7 is a cross-sectional view of the semiconductor structure of FIG. 6 where a plurality of conducting layers and a first photoresist are deposited, in accordance with an embodiment of the present invention.

FIG. 7 is a cross-sectional view of the semiconductor structure of FIG. 6 where a plurality of conducting layers and a first photoresist are deposited, in accordance with an embodiment of the present invention.

In various embodiments, a plurality of conducting layers 50, 52, 54 and a first photoresist layer 56 are deposited. The first conducting layer 50 can be a TaN layer. The second conducting layer 52 can be a ruthenium (Ru) layer. The third conducting layer 54 can be a TaN layer. The first and third layers 50, 54 can have a thickness of about 5 nm in one example embodiment. The second layer 52 can have a thickness of about 20 nm in one example embodiment. The first, second, and third conducting layers 50, 52, 54 extend along an entire length of the structure 30'.

Photolithography is a process which uses light to transfer a geometric pattern from a photomask to a substrate such as a silicon wafer. In a photolithography process, a photoresist layer is first formed on the substrate. The substrate is baked to remove any solvent remained in the photoresist layer. The photoresist is then exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution, usually an aqueous base solution, to form a pattern in the photoresist layer. The patterned photoresist can then be used as a mask for subsequent fabrication processes on the substrate, such as deposition, etching, or ion implantation processes.

There are two types of photoresist: positive resist and negative resist. A positive resist is initially insoluble in the developer solution. After exposure, the exposed region of the resist becomes soluble in the developer solution and is then selectively removed by the developer solution during the subsequent development step. The unexposed region of the positive resist remains on the substrate to form a pattern in the photoresist layer. The selective removal of the exposed region of a photoresist is thus called "positive development."

A negative resist behaves in the opposite manner. The negative resist is initially soluble in the developer solution. Exposure to radiation typically initiates a crosslinking reaction which causes the exposed region of the negative resist to become insoluble in the developer solution. During the subsequent development step, the unexposed region of the negative resist is selectively removed by the developer solution, leaving the exposed region on the substrate to form a pattern. Contrary to the "positive development," a "negative development" refers to a process that selectively removes the unexposed region of a photoresist.

Figure 8:
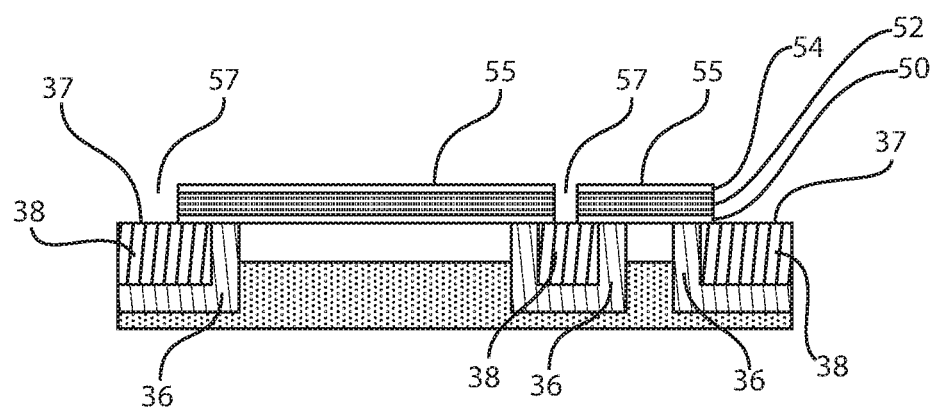
FIG. 8 is a cross-sectional view of the semiconductor structure of FIG. 7 where the first photoresist is etched to expose a top surface of one of the conducting layers, in accordance with an embodiment of the present invention.

FIG. 8 is a cross-sectional view of the semiconductor structure of FIG. 7 where the first photoresist is etched to expose a top surface of one of the conducting layers, in accordance with an embodiment of the present invention.

In various embodiments, the first photoresist 56 is etched to expose the top surface 55 of the third conducting layer 54. The etching results in gaps or recesses 57 formed between the conducting layers 50, 52, 54. This further results in the exposure of the top surface 37 of the oxide layer 38 at the gaps or recesses 57. Thus, the metal lines 50, 52, 54 are patterned by, for example, a plasma etch.

However, the etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

Figure 9:
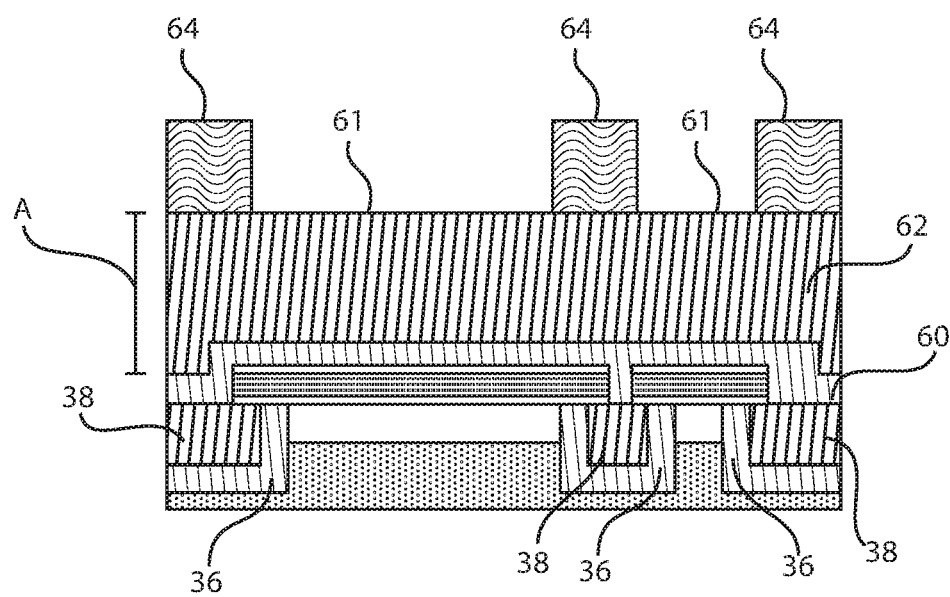
FIG. 9 is a cross-sectional view of the semiconductor structure of FIG. 8 where a nitride layer, an oxide layer, and a second photoresist layer are deposited, in accordance with an embodiment of the present invention.

FIG. 9 is a cross-sectional view of the semiconductor structure of FIG. 8 where a nitride layer, an oxide layer, and a second photoresist layer are deposited, in accordance with an embodiment of the present invention.

In various embodiments, an insulating layer 60 is deposited or formed over the first, second, and third conducting layers 50, 52, 54. The insulating layer 60 can be, e.g., a SiN layer. An oxide layer 62 is then deposited or formed over the SiN layer 60. The oxide layer 62 can be, e.g., an ILD 62 having a height "A," which is greater than the height of the SiN layer 60. The oxide layer 62 has a top surface 61, which can be planarized in one example embodiment. A second photoresist 64 is then formed over portions of the top surface 61 of the oxide layer 62.

Figure 10:
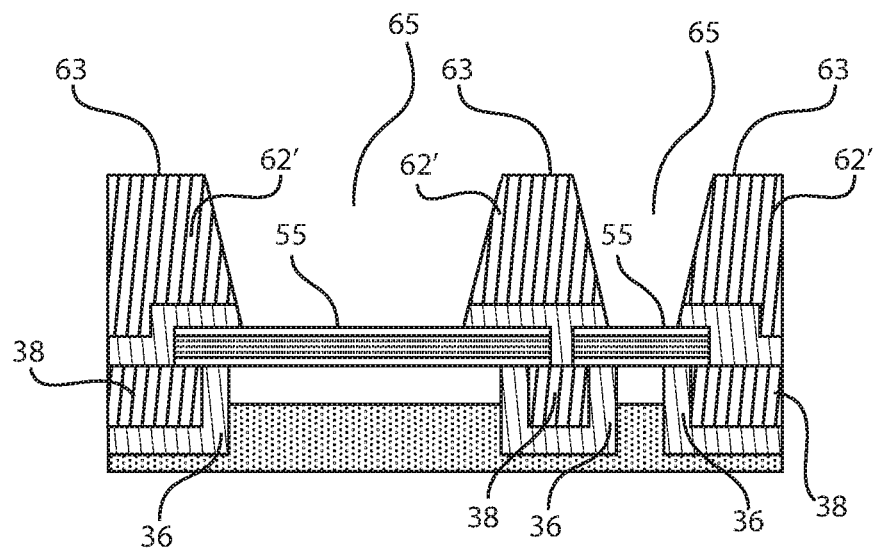
FIG. 10 is a cross-sectional view of the semiconductor structure of FIG. 9 where the second photoresist and portions of the oxide layer are etched to expose portions of the top surface of one of the conducting layers, in accordance with an embodiment of the present invention.

FIG. 10 is a cross-sectional view of the semiconductor structure of FIG. 9 where the second photoresist and portions of the oxide layer are etched to expose portions of the top surface of one of the conducting layers, in accordance with an embodiment of the present invention.

In various embodiments, a further etch takes place to etch away portions of the oxide layer and expose top surfaces of the metal line 54. For example, plasma etching can be performed in one example embodiment. The etching results in trenches 65 formed between the remaining oxide sections 62'. The remaining oxide sections 62' have a top surface 63. The trenches 65 extend to a top surface 55 of the third conducting layer 54. It is noted that only a portion of the top surface 55 of the metal line 54 is exposed within the trenches 65.

Figure 11:
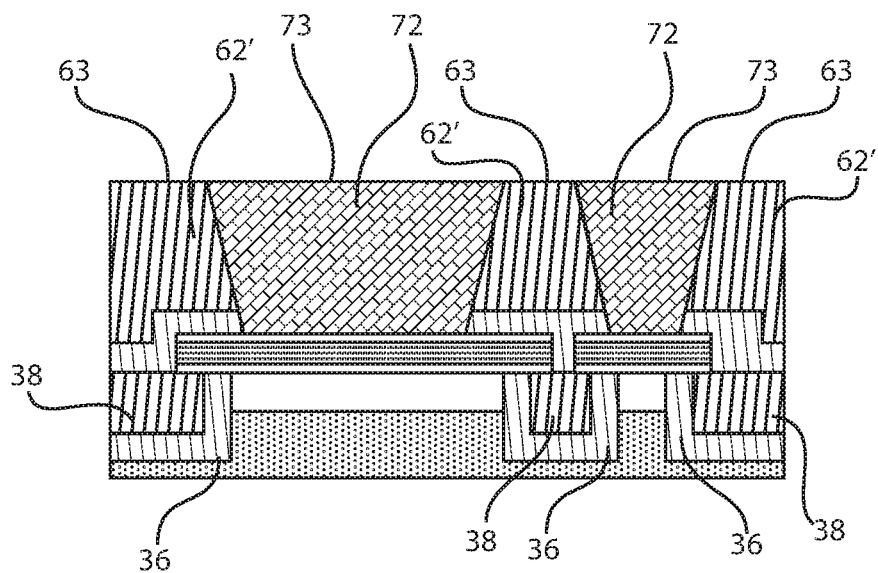
FIG. 11 is a cross-sectional view of the semiconductor structure of FIG. 10 where the recesses or trenches between the oxide layer portions are filled with a metal, in accordance with an embodiment of the present invention.

FIG. 11 is a cross-sectional view of the semiconductor structure of FIG. 10 where the recesses or trenches between the oxide layer portions are filled with a metal, in accordance with an embodiment of the present invention.

In various embodiments, a metal fill takes place within the trenches 65. The metal 72 can be, e.g., copper (Cu). The top surface 73 of the Cu 72 can extend up to the top surface 63 of the remaining oxide sections 62'. Thus, the Cu 72 can be planarized to be flush with the remaining oxide sections 62'. The final structure 80 is a MT (metal trench) copper (Cu) structure.

Therefore, in the second embodiment, the planarized nature of the MTJs is utilized to deposit a metal layer stack including TaN, Ru, and TaN layers over the top of the MTJs. These layers or stack is then patterned using the inverted lithographic pattern of the MT trench and the metal is subtractively etched to generate an MT line over the MTJs. A SiN encapsulation layer is then deposited over the metal line and the damascene MT layer is built over this metal line.

The main advantages of this contact method are at least (i) the lack of micro-trenching around MTJs due to the presence of a metal line over the top of the hard-mask, (ii) an almost infinite process window due to etch resistance of Ru to CFx chemistry used to etch SiOx and SiN, (iii) ensuring consistent heights of active devices of differing CDs, and (iv) the capability to electrically test the device contact and rework the device level, if necessary.

Figure 12:
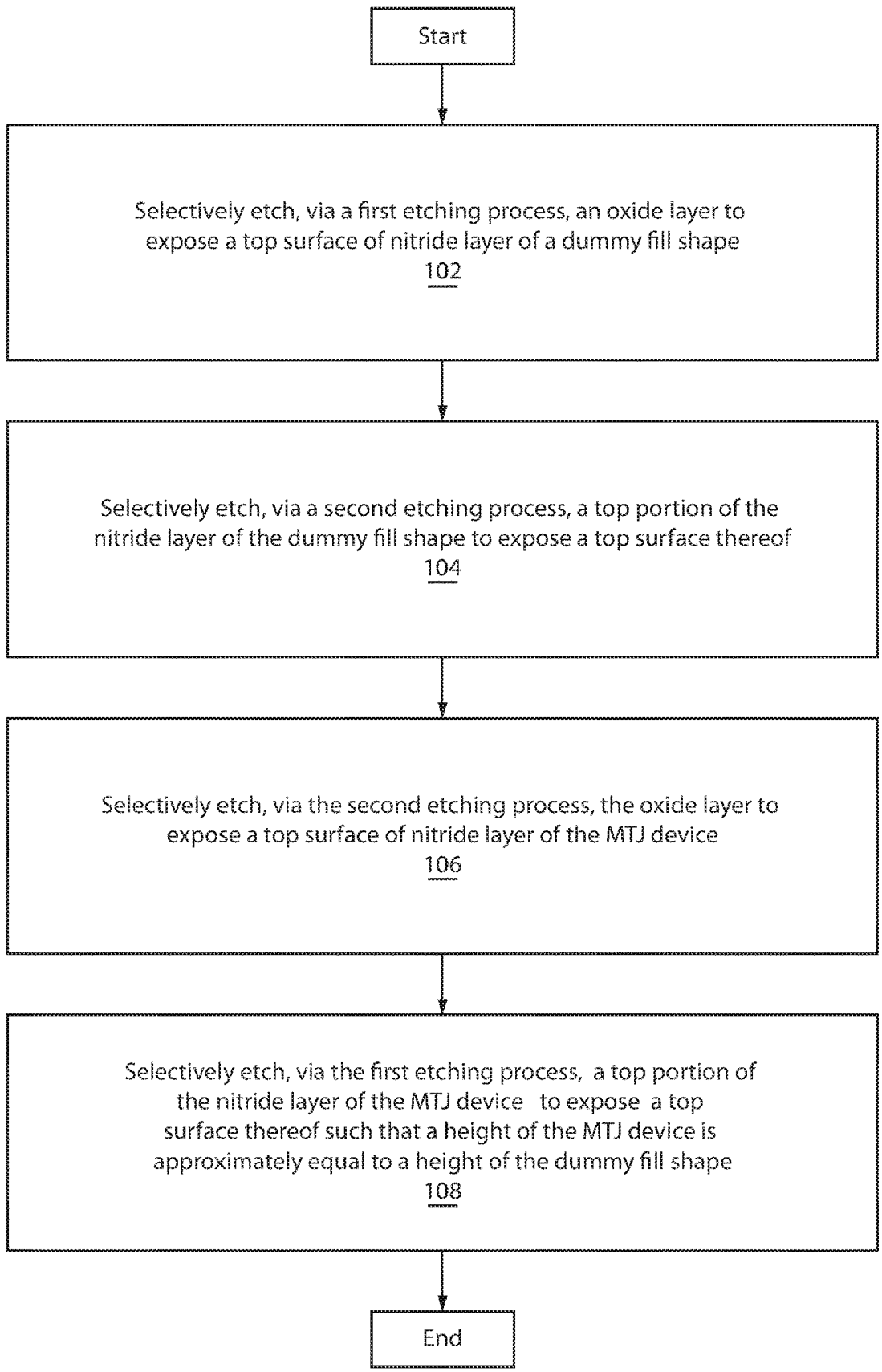
FIG. 12 is a is a block/flow diagram of an exemplary method for establishing a top contact to a MTJ device, in accordance with an embodiment of the present invention.

FIG. 12 is a is a block/flow diagram of an exemplary method for establishing a top contact to a MTJ device, in accordance with an embodiment of the present invention.

At block 102, selectively etch, via a first etching process, an oxide layer to expose a top surface of a nitride layer of a dummy fill shape.

At block 104, selectively etch, via a second etching process, a top portion of the nitride layer of the dummy fill shape to expose a top surface thereof.

At block 106, selectively etch, via the second etching process, the oxide layer to expose a top surface of a nitride layer of the MTJ device.

At block 108, selectively etch, via the first etching process, a top portion of the nitride layer of the MTJ device to expose a top surface thereof such that a height of the MTJ device is approximately equal to a height of the dummy fill shape.

Figure 13:
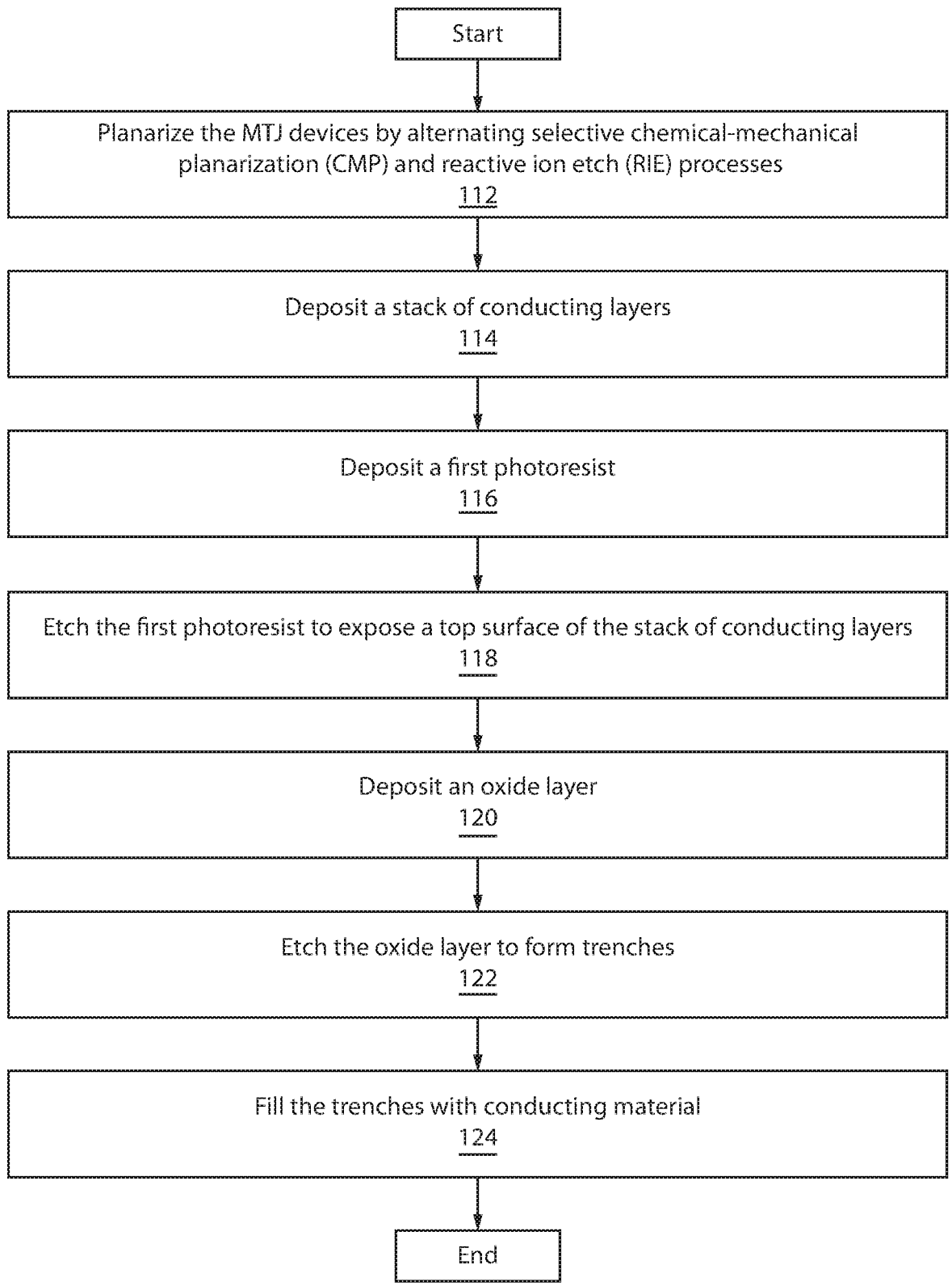
FIG. 13 is a is a block/flow diagram of an exemplary method for establishing a top contact to a MTJ device with a metal line formation over the planarized junctions, in accordance with an embodiment of the present invention.

FIG. 13 is a is a block/flow diagram of an exemplary method for establishing a top contact to a MTJ device with a metal line formation over the planarized junctions, in accordance with an embodiment of the present invention.

At block 112, the MTJ devices are planarized by alternating selective chemical-mechanical planarization (CMP) and reactive ion etch (RIE) processes.

At block 114, a stack of conducting layers is deposited.

At block 116, a first photoresist is deposited.

At block 118, the first photoresist is etched to expose a top surface of the stack of conducting layers.

At block 120, an oxide layer is deposited.

At block 122, the oxide layer is etched to form trenches.

At block 124, the trenches are filled with a conducting material.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated by using chemical-mechanical planarization (CMP) and reactive ion etching (RIE) to establish a top contact to active magnetic tunnel junction (MTJ) devices (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure for establishing a top contact to a first device, the structure comprising: the first device; a second device, the first and second devices planarized by alternating a first etch process and a second etch process based on a predetermined height offset between the first and second devices such that the first and second devices are uniformly contacted across a wafer, and a U-shaped dielectric layer separating the first device from the second device, the U-shaped dielectric layer positioned, in its entirety, directly between the first and second devices, wherein the first device is a magnetic tunnel junction (MTJ) device and the second device is a dummy fill shape.

2. The structure of claim 1, wherein the first etch process is a chemical-mechanical planarization (CMP) process and the second etch process is a reactive ion etch (RIE) process.

3. The structure of claim 1, wherein the U-shaped dielectric layer directly contacts both the first and second devices.

4. The structure of claim 1, wherein the uniform top contact across the wafer is defined without exposure to reactive plasma chemistries.

5. The structure of claim 1, wherein alternating the first etch process and the second etch process involves a first dielectric layer selectively etched by the first etch process to expose a top surface of a second dielectric layer of the second device.

6. The structure of claim 5, wherein alternating the first etch process and the second etch process further involves a top portion of the second dielectric layer of the second device selectively etched by the second etch process to expose a top surface thereof.

7. The structure of claim 6, wherein alternating the first etch process and the second etch process further involves the first dielectric layer selectively etched by the second etch process to expose a top surface of a third dielectric layer of the first device.

8. The structure of claim 7, wherein alternating the first etch process and the second etch process further involves a top portion of the third dielectric layer of the first device selectively etched by the first etch process to expose a top surface thereof.

9. The structure of claim 8, wherein alternating the first etch process and the second etch process results in a height of the first device being approximately equal to a height of the second device.

10. A structure for establishing a top contact for a plurality of magnetic tunnel junction (MTJ) devices by planarizing the MTJ devices by alternating first and second etch processes, the structure comprising: a stack of conducting layers; a first device and a second device both horizontally misaligned with respect to the stack of conducting layers; a first dielectric layer disposed over the stack of conducting layers; a second dielectric layer disposed over the first dielectric layer; trenches extending within the first and second dielectric layers; and a conducting material disposed within the trenches, wherein the first device is a magnetic tunnel junction (MTJ) device and the second device is a dummy fill shape.

11. The structure of claim 10, wherein the first etch process is a chemical-mechanical planarization (CMP) process and the second etch process is a reactive ion etch (RIE) process.

12. The structure of claim 11, wherein the stack of conducting layers includes a first layer, a second layer, and a third layer.

13. The structure of claim 12, wherein the first layer is a first tantalum nitride (TaN) layer, the second layer is a ruthenium (Ru) layer, and the third layer is a second tantalum nitride (TaN) layer.

14. The structure of claim 13, wherein the first and second TaN layers have a thickness of about 5 nm.

15. The structure of claim 13, wherein a thickness of the Ru layer is about 20 nm.

16. The structure of claim 10, wherein the conducting material is copper (Cu).

17. The structure of claim 16, wherein the Cu contacts a top surface of the stack of conducting layers to create metal trench Cu lines over the plurality of MTJ devices.

18. The structure of claim 17, wherein the plurality of MTJs devices are substantially aligned with the conducting material.

* * * * *